US 9,500,704 B2

(12) United States Patent
Soma

(10) Patent No.: US 9,500,704 B2
(45) Date of Patent: Nov. 22, 2016

(54) SEMICONDUCTOR DEVICE WHICH CAN DETECT ABNORMALITY

(71) Applicant: Renesas Electronics Corporation, Kanagawa (JP)

(72) Inventor: Osamu Soma, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 247 days.

(21) Appl. No.: 14/184,230

(22) Filed: Feb. 19, 2014

(65) Prior Publication Data
US 2014/0239988 A1 Aug. 28, 2014

(30) Foreign Application Priority Data
Feb. 25, 2013 (JP) .................................. 2013-035170

(51) Int. Cl.
*G01R 31/28* (2006.01)
*G01R 31/317* (2006.01)

(52) U.S. Cl.
CPC ..... *G01R 31/31715* (2013.01); *G01R 31/2851* (2013.01)

(58) Field of Classification Search
CPC .......... G01R 31/31715; G01R 31/28–31/2898
USPC ............... 324/750.3, 750.1–759.03, 522
See application file for complete search history.

(56) References Cited

U.S. PATENT DOCUMENTS

| 5,136,246 | A | * | 8/1992 | Sakamoto | .......... | G01R 31/3648 324/426 |
| 6,696,871 | B2 | * | 2/2004 | Bienvenu | ............... | H03K 17/18 327/134 |
| 7,102,910 | B2 | * | 9/2006 | Pham | ..................... | G11C 17/18 365/100 |
| 7,814,795 | B2 | * | 10/2010 | Lee | ......................... | G01G 3/13 73/54.24 |
| 2013/0141107 | A1 | * | 6/2013 | Yuasa | ................ | G01R 31/3624 324/426 |

FOREIGN PATENT DOCUMENTS

JP 2007-053894 A 3/2007

* cited by examiner

*Primary Examiner* — Melissa Koval
*Assistant Examiner* — Rahul Maini
(74) *Attorney, Agent, or Firm* — Foley & Lardner LLP

(57) ABSTRACT

A semiconductor device includes: a drive circuit; a standby circuit; and a detection circuit. The drive circuit turns on an output transistor connected to a load based on an active input signal. The standby circuit intermittently outputs an output signal based on a non-active input signal. The detection circuit measures voltage of a load side of the output transistor based on the output signal and output a measurement result.

14 Claims, 12 Drawing Sheets

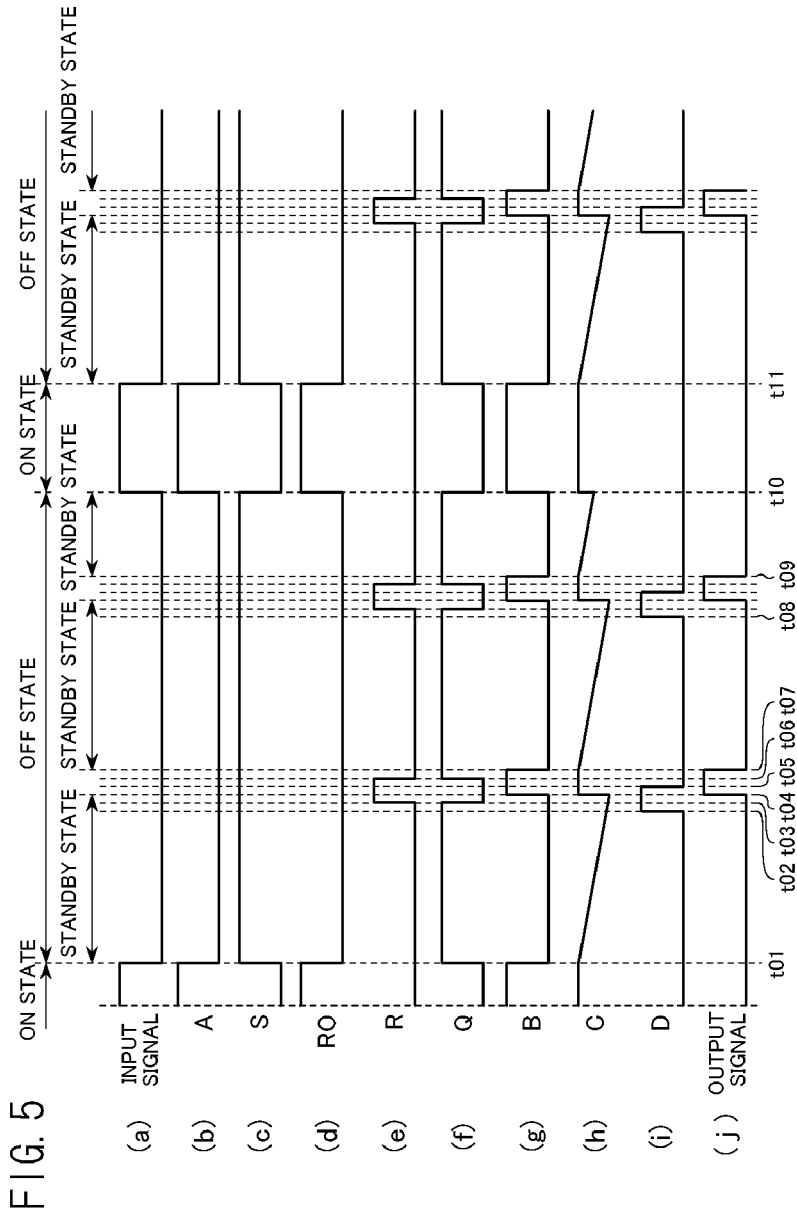

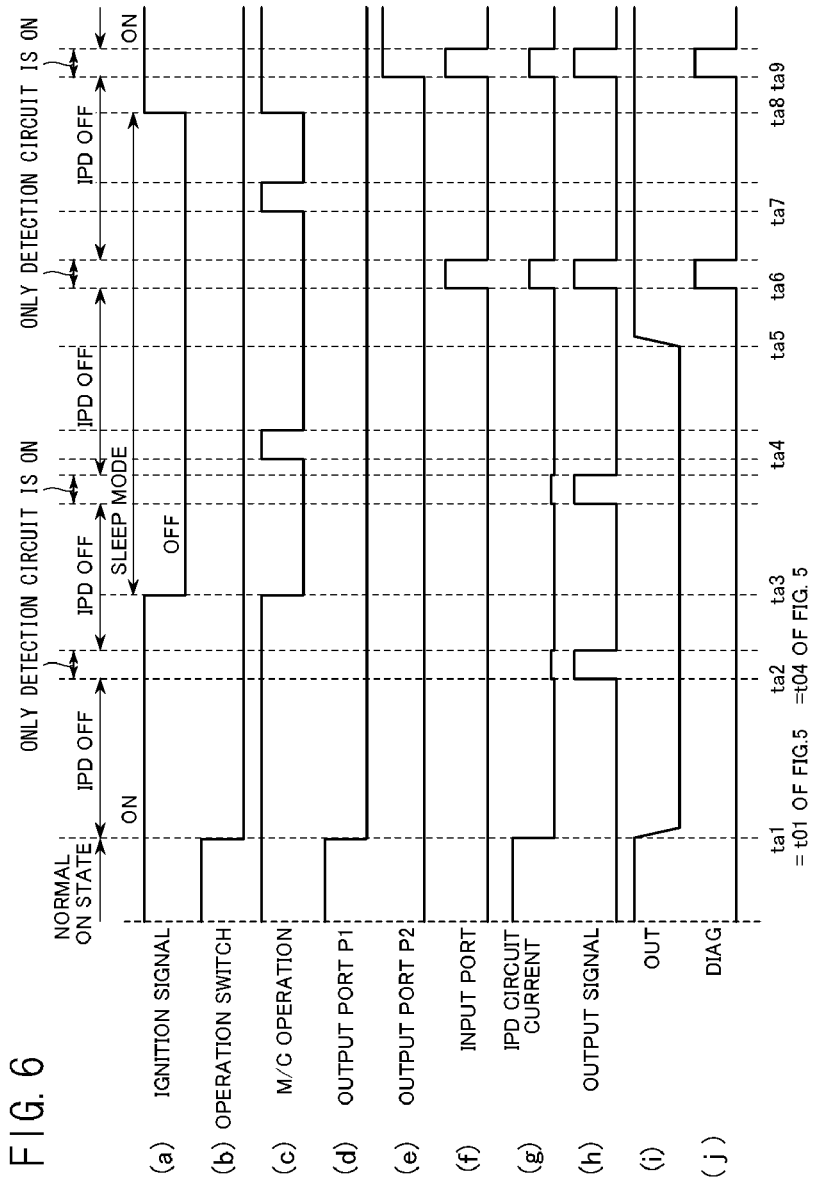

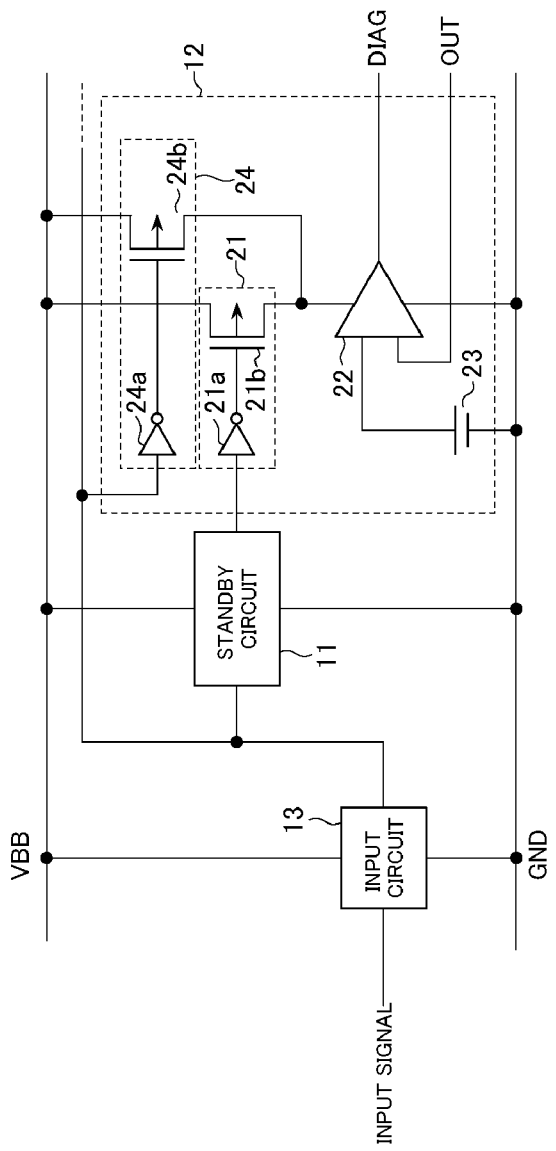

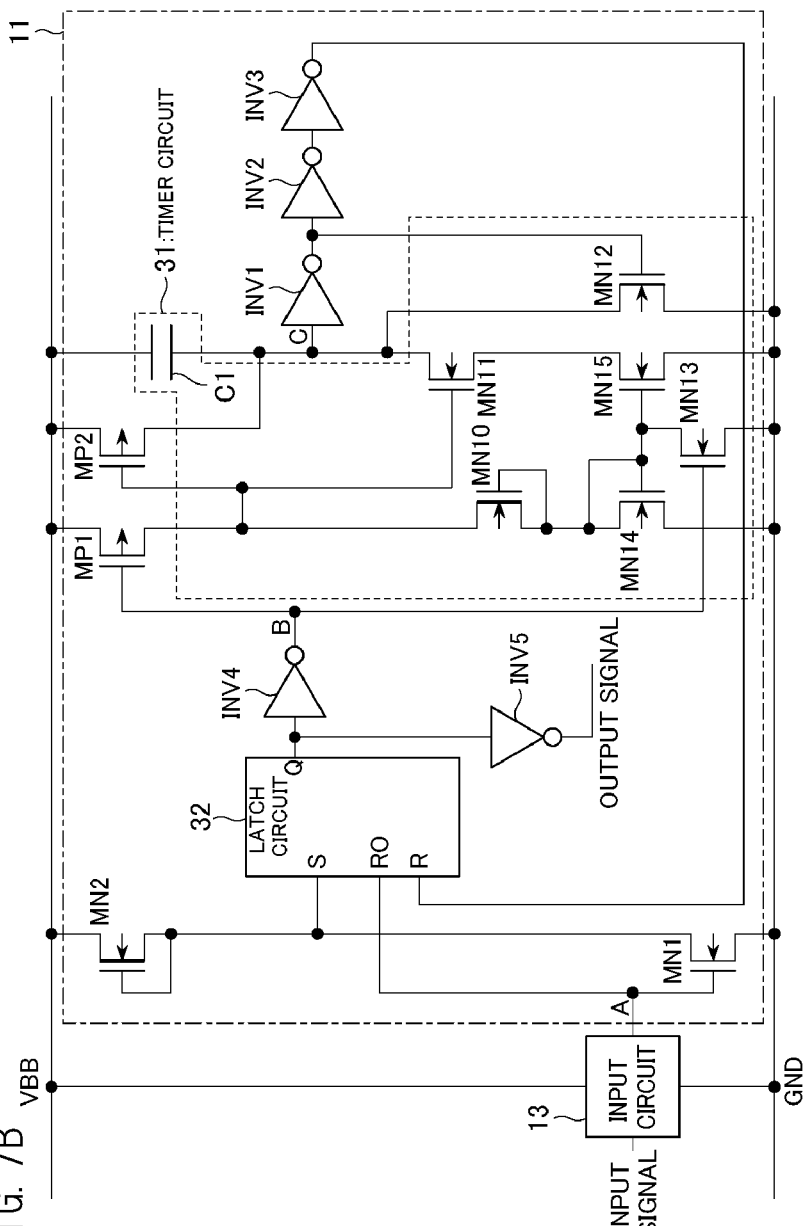
F I G. 7B

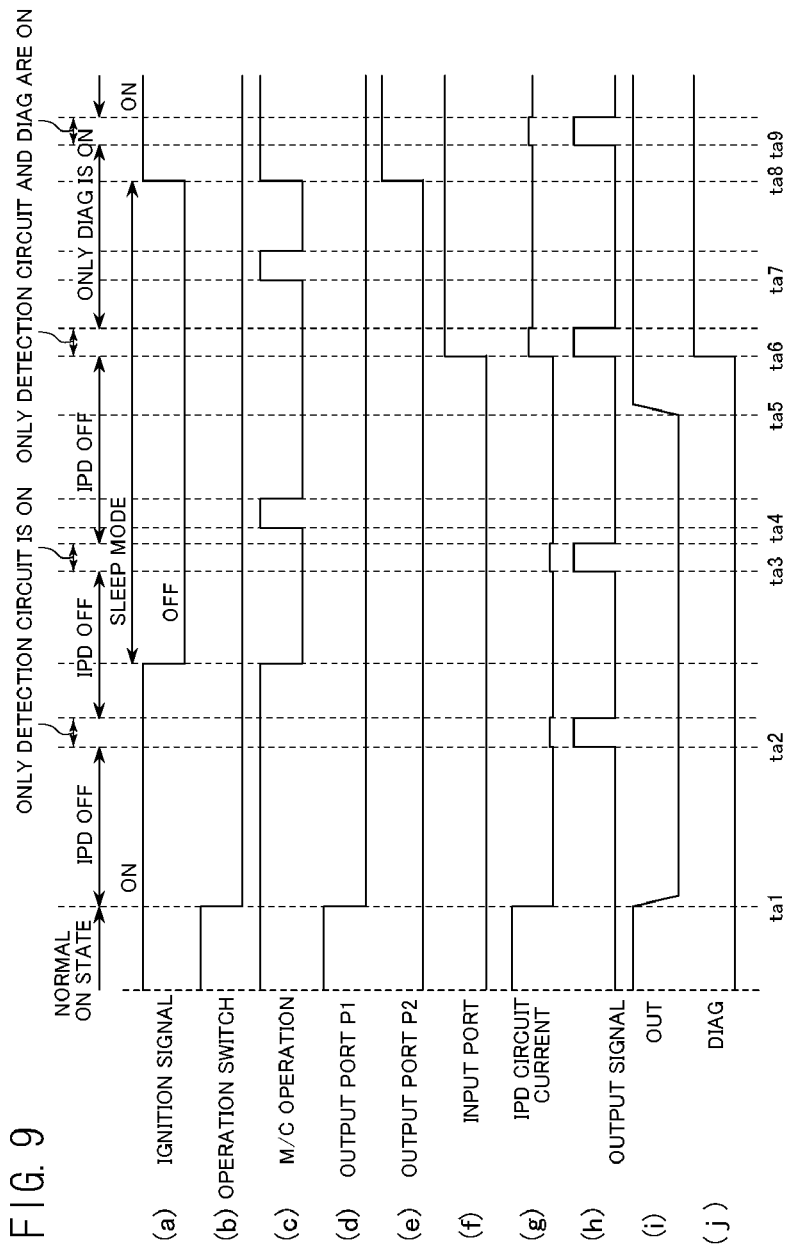

SEMICONDUCTOR DEVICE WHICH CAN DETECT ABNORMALITY

INCORPORATION BY REFERENCE

This application is based upon and claims the benefit of priority from Japanese patent application No. 2013-035170 filed on Feb. 25, 2013, the disclosure of which is incorporated herein in its entirety by reference.

TECHNICAL FIELD

The present invention relates to a semiconductor device and is preferably applied to, for example, a semiconductor device which is used as an IPD (Intelligent Power Device).

BACKGROUND ART

An IPD (Intelligent Power Device) is known as a semiconductor device used for an electronic component of equipment such as an automobile. The IPD has functions that monitor states of connected loads in the equipment. For example, one of the functions is called load open detection which checks whether or not a load is connected. If the load open occurs, the load is not connected appropriately. The function of the load open detection is required to execute the load open detection even when input is in an off-state (the IPD is in a non-operating state). Therefore, the IPD is provided with a dedicated input terminal separately from an input terminal for controlling an on/off of the IPD. Here, the dedicated input terminal is used for making a detection circuit and output circuit operate. The detection circuit executes the load open detection and the output circuit outputs an abnormality signal when abnormality is detected by the detection circuit. When the input is in an off-state (the IPD is in a non-operating state), a microcomputer intermittently (periodically) inputs a control signal into the dedicated input terminal and thereby the IPD intermittently (periodically) checks the state of the load.

As a related art, a motor control device is disclosed in JP 2007-53894 A (related to US2007035896 (A1)). The motor control device includes a motor operating by being supplied with electric power from a vehicle power source and a control section controlling the motor driving. The control section includes an estimation temperature calculating means, a mode switching means and an activating means. The estimation temperature calculating means calculates an estimation temperature of the motor. The mode switching means switches an operation mode of the control section from a normal operation mode enabling the motor driving to a sleep mode consuming less electric power than that of the normal operation mode based on a predetermined condition when the motor is stopped. The activating means makes the estimation temperature calculating means operate during a predetermined active time period every predetermined sleep time period in the sleep mode. The estimation temperature calculating means calculates the estimation temperature during the active time period.

CITATION LIST

Patent Literature

[PTL 1] JP 2007-53894 A

SUMMARY OF INVENTION

As described above, the IPD is required to have the dedicated input terminal for checking the state of the load when the input is in an off-state (the IPD is in a non-operating state). Here, since the number of terminals (pins) of the IPD is preferably as low as possible, the dedicated input terminal is preferably reduced. As a method for reducing the dedicated input terminal, the method may be considered that the IPD checks the state of the load while not being changed into a non-operating state but being maintained in an operation state. However, it is not preferable because not only a burden to the microcomputer is increased but also standby current in the IPD is increased. A technique is desired that can reduce the number of terminals (pins) while decreasing a burden to a microcomputer and reducing electric power consumption in the checking of the state of the load.

Other objects and new features of the present invention will be apparent from the following descriptions and the accompanying drawings.

In one embodiment, a semiconductor device (an IPD) includes a function that can intermittently and automatically perform an operation of checking a state of a load when the semiconductor device (the IPD) is in a non-operating state.

According to the embodiment, the number of terminals (pins) can be reduced while a burden to a microcomputer is decreased and electric power consumption is reduced in the checking of a state of a load.

BRIEF DESCRIPTION OF THE DRAWINGS

FIG. 5 is a timing chart showing an example of an operation of the standby circuit according to the first embodiment;

FIG. 6 is a timing chart showing an example of an operation of an electronic component system according to the first embodiment;

FIG. 7A is a block diagram partially showing a configuration of a semiconductor device according to a second embodiment;

FIG. 7B is a circuit diagram showing an example of a configuration of a standby circuit according to the second embodiment;

FIG. 9 is a timing chart showing an example of an operation of an electronic component system according to the third embodiment.

DESCRIPTION OF THE PREFERRED EMBODIMENTS

The semiconductor device according to embodiments will be described below with reference to the attached drawings.

Hereinafter, an example in which the semiconductor device is applied to an automobile will be described in each embodiment.

First Embodiment

Figure 1A:
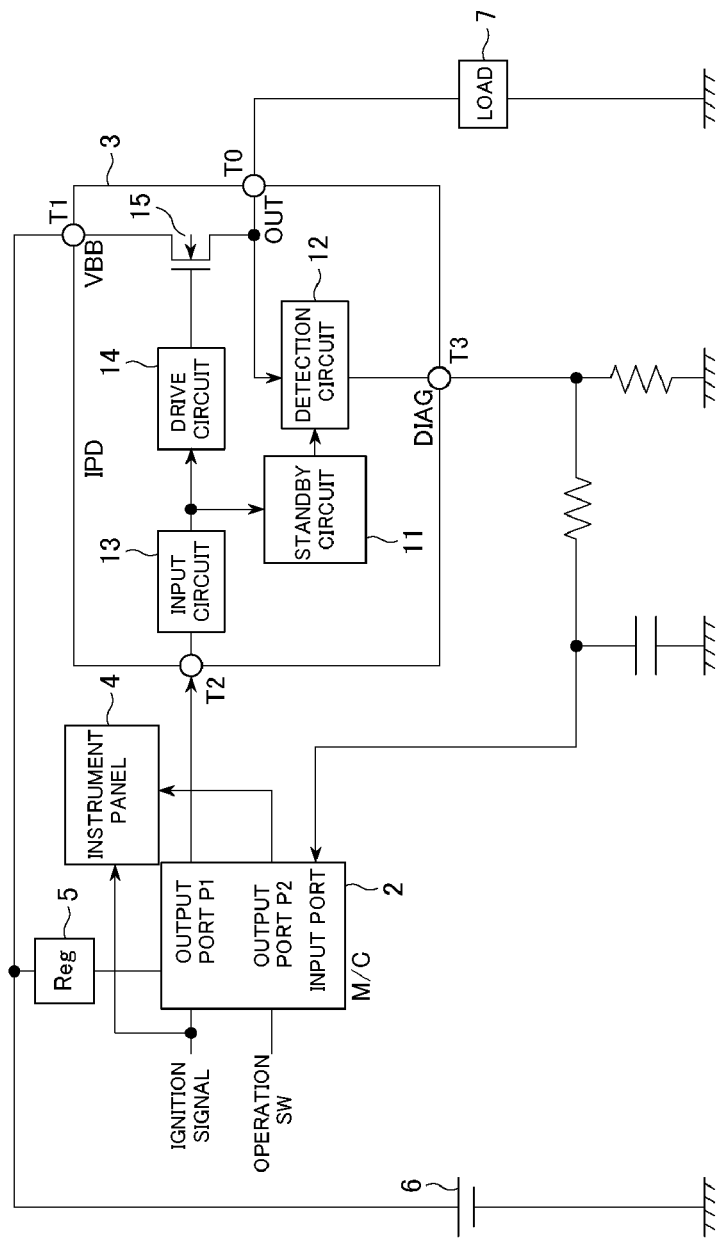
FIG. 1A is a block diagram showing a configuration of a semiconductor device and a usage example according to a first embodiment.

A configuration of the semiconductor device according to the first embodiment will be described. FIG. 1A is a block diagram showing the configuration of the semiconductor device and its usage example according to the present embodiment. A semiconductor device 3 is an IPD (Intelligent Power Device) configured by one semiconductor chip or a plurality of semiconductor chips. This figure shows the usage example in which one semiconductor chip (3) is applied to an electronic component system 1 of an automobile. This electronic component system 1 includes a microcomputer (M/C) 2, the semiconductor device 3, an electric power source 6 and a load 7.

The microcomputer 2 includes an output port P1 and input port. The microcomputer 2 outputs an input signal for controlling the semiconductor device 3 from the output port P1 to the semiconductor device 3. The semiconductor device 3 includes an input terminal T2, an output terminal T3, a load terminal T0 and an electric power source terminal T1. The input terminal T2 is connected to the output port P1, the output terminal T3 is connected to the input port, the load terminal T0 is connected to the load 7 and the electric power source terminal T1 is connected to the electric power source 6. The semiconductor device 3 controls connection between the load 7 and the electric power source 6 (electric power supply from the electric power source 6 to the load 7) based on the input signal from the output port P1 of the microcomputer 2 to the input terminal T2. In addition, the semiconductor device 3 checks a state of the load 7 (voltage of the load terminal T0) based on the input signal from the microcomputer 2 being active or non-active (the semiconductor device 3 being in an operation state or a non-operation state). The state of the load 7 is outputted from the output terminal T3 to the input port of the microcomputer 2. Here, in the case that the electronic component system 1 is the electronic component system for an automobile, the electric power source 6 is exemplified as a battery of the automobile. The load 7 is exemplified as a device which does not work with an ignition (a device which can be ON even if the ignition is OFF) such as a lamp, an air conditioner or car audio. The semiconductor device 3 is connected to the high side of the load 7. According to a configuration and an operation of the semiconductor device 3 as described later, this electronic component system 1 can reduce the number of terminals (pins) of the semiconductor device 3 while decreasing a burden to a microcomputer and reducing electric power consumption when checking the state of the load.

The microcomputer 2 becomes in an ON state in response to an ignition signal. The microcomputer 2 outputs the input signal from the output port P1 to the semiconductor device 3 when an operation SW (a mechanical switch or a remote control switch) operating the load 7 becomes ON, without depending on the ignition signal. The microcomputer 2 is supplied with electric power from, for example, the electric power source 6 through a regulator 5. The microcomputer 2 outputs the state of the load 7 (the state of the voltage of the load terminal T0) received at the input port from the output port P2 to an instrument panel 4 (a display device). The instrument panel 4 displays the state of the load 7.

Next, the semiconductor device 3 will be described.

The semiconductor device 3 includes a drive circuit 14, a detection circuit 12, an input circuit 13, a standby circuit 11 and an output transistor 15. The drive circuit 14 turns on the output transistor 15 in response to an active input signal (an input signal which makes the semiconductor device 3 be in an operating state) supplied from the input terminal T2 through the input circuit 13. The drive circuit 14 turns off the output transistor 15 in response to a non-active input signal (an input signal which makes the semiconductor device 3 be in a non-operating state) supplied from the input terminal T2 through the input circuit 13.

The standby circuit 11 makes the detection circuit 12 operate intermittently in response to the non-active input signal. That is, the standby circuit 11 intermittently outputs an output signal to the detection circuit 12 in response to the non-active input signal. Here, the standby circuit 11 does not output the output signal to the detection circuit 12 in response to the active input signal. However, as described later (in the second embodiment), the standby circuit 11 may output the output signal to the detection circuit 12 in response to the active input signal.

The detection circuit 12 measures voltage at the load terminal T0 side of the output transistor 15 in response to the non-active input signal to output the measurement result to the output terminal T3. For example, when the voltage is higher than a reference voltage, the detection circuit 12 judges the load open and then outputs a signal (a load open detection signal) indicating the load open. There may be plural reference voltages, and the outputted load open detection signal may be current or voltage. For example, the microcomputer 2 judges whether or not the load open occurs based on the load open detection signal.

The output transistor 15 is electrically connected to the load terminal T0 at a source, connected to the electric power source terminal T1 at a drain and connected to the drive circuit 14 at a gate, respectively. When the output transistor 15 is ON, the output transistor 15 connects the electric power source 6 to the load 7 (the electric power of the electric power source 6 is supplied to the load 7). In addition, when the output transistor 15 is OFF, the output transistor 15 disconnects the electric power source 6 from the load 7 (the electric power supply from the electric power source 6 to the load 7 is stopped). The detail of the standby circuit 11 and the detection circuit 12 will be described later.

When the input signal is non-active, the semiconductor device 3 becomes in a non-operating state. Under that state, in the case that the detection circuit 12 is made to operate for checking the state of the load 7, normally, a dedicated input terminal for making the detection circuit 12 operate is required separately from the input terminal T2 for controlling the operation of the semiconductor device 3. However, in the present embodiment, the dedicated input terminal is not provided, but the standby circuit 11 for controlling the operation of the detection circuit 12 is newly provided. The standby circuit 11 can stop the operation of the detection circuit 12 in response to the active input signal and start the operation of the detection circuit 12 in response to the non-active input signal. Therefore, when the state of the load 7 is checked, by using the standby circuit 11, it is unnecessary to provide the dedicated input terminal for making the detection circuit 12 operate. Correspondingly, in the microcomputer 2, it is unnecessary to provide a dedicated output port for outputting a control signal to the dedicated input terminal of the semiconductor device 3. Thus, the burden to the microcomputer 2 can be reduced.

Further, when receiving a non-active input signal (when the semiconductor device 3 is in a non-operating state), the standby circuit 11 makes the detection circuit 12 operate not continuously but intermittently. That is, the operation time of the detection circuit 12 can be reduced as compared with the case of the continuous operation of the detection circuit 12. Thus, the circuit current for checking the state of the load 7 can be decreased and the electric power consumption can be suppressed lower by using the standby circuit 11.

The output transistor 15 is a transistor connected between the electric power source terminal T1 and the load terminal T0 to control a current flow between both terminals. By using it, the electric power supply from the electric power source 6 to the load 7 can be controlled. The output transistor 15 is exemplified as a MOS (Metal Oxide Semiconductor) transistor. In the example of this figure, an N-ch MOS transistor is used. The MOS transistor is exemplified as a DMOS (Diffused MOS) transistor, a LDMOS (Lateral Diffused MOS) transistor, or a vertical MOS transistor. More than one transistor may be provided as the output transistor 15.

Figure 1B:
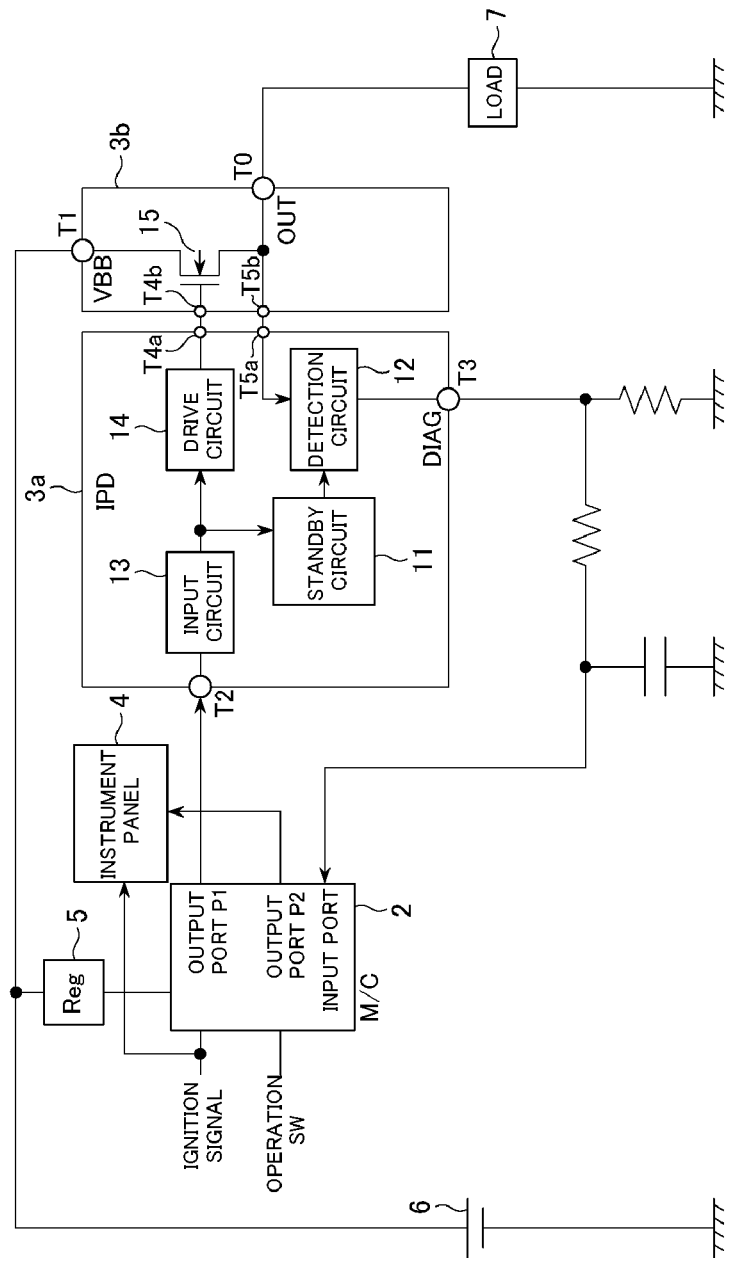
FIG. 1B is a block diagram showing a configuration of the semiconductor device and another usage example according to the first embodiment.

In this way, the semiconductor device 3 may be the IPD configured by one semiconductor chip. In this case, the configuration of the electronic component system 1 is simpler and the manufacturing of the electronic component system 1 is easier. However, as described above, the semiconductor device 3 may be the IPD configured by a plurality of semiconductor chips. FIG. 1B is a block diagram showing a configuration of the semiconductor device and another usage example according to the present embodiment. This figure shows the usage example in which two semiconductor chips 3a, 3b are applied to the electronic component system 1 of the automobile. One semiconductor chip 3a includes the input circuit 13, the standby circuit 11, the detection circuit 12 and the drive circuit 14. The other semiconductor chip 3b includes the output transistor 15. Both of these semiconductor chips are connected to each other at terminals T4a and T4b and at terminals T5a and T5b. When the semiconductor device 3 is configured by the two semiconductor chips 3a and 3b, the semiconductor chip 3b including the output transistor 15 can be changed depending on the load 7, thereby it is easy to handle various use applications. Hereinafter, the case of FIG. 1A will be described.

Figure 2:
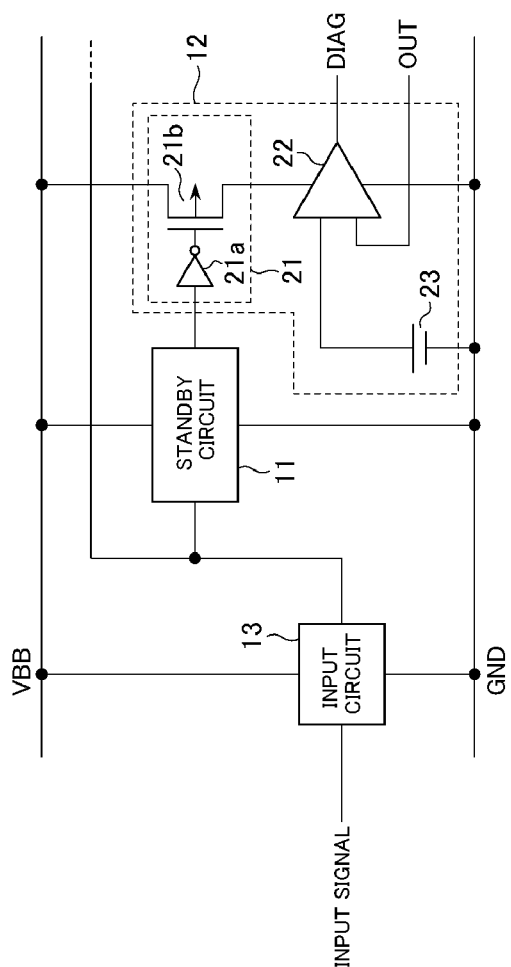
FIG. 2 is a block diagram partially showing a configuration of the semiconductor device according to the first embodiment.

FIG. 2 is a block diagram partially showing a configuration of the semiconductor device 3 cording to the present embodiment. The input signal inputted through the input circuit 13 is supplied to the standby circuit 11 and the drive circuit 14 (not shown here). In other words, the input signal supplied to the drive circuit 14 is the same as the signal supplied to the standby circuit 11. Therefore, it is unnecessary to generate a new signal for the standby circuit 11 and also it is unnecessary to newly provide a terminal (a pin) for the signal of the standby circuit 11 in the semiconductor device 3.

The standby circuit 11 is supplied with a second reference voltage, e.g. VBB, and a first reference voltage GND. The standby circuit 11 supplies an output signal to the detection circuit 12 based on the input signal. Specifically, the standby circuit 11 stops the supply of the output signal to the detection circuit 12 (or supplies a non-active output signal to the detection circuit 12) in the case that the input signal is active. On the other hand, the standby circuit 11 intermittently (periodically) supplies the output signal to the detection circuit 12 (or intermittently supplies an active output signal to the detection circuit 12) in the case that the input signal is non-active. In other words, in the case that the input signal is in a non-operating state (the load 7 is in an OFF state), the standby circuit 11 starts an intermittent operation.

The detection circuit 12 includes a switch section 21 and a comparison section 22. ON/OFF of the switch section 21 is controlled by the output signal of the standby circuit 11.

The switch section 21 includes, for example, an inverter 21a and a P-ch transistor 21b. The inverter 21a is connected to the standby circuit 11 at an input node and to a gate of the P-ch transistor 21b at an output node. The P-ch transistor 21b is connected to the second reference voltage VBB at a source and connected to one of electric power source nodes of the comparison section 22 at a drain. When a signal with a High level is inputted to the inverter 21a, the P-ch transistor 21b is turned on.

The comparison section 22 is a comparison circuit and connected to the first reference voltage GND at the other of the electric power source nodes. Therefore, current supply to the comparison section 22 is controlled by the output signal of the standby circuit 11. That is, when the output signal is supplied (or the output signal is active), the switch section 21 is turned on and current is supplied to the comparison section 22. Consequently, the comparison section 22 operates. On the other hand, when the output signal is not supplied (or the output signal is non-active), the switch section 21 is turned off and the current is not supplied to the comparison section 22. Consequently, the comparison section 22 does not operate.

The comparison section 22 operates as described below when the output signal is supplied, namely the current is supplied. The third reference voltage, namely 3 V is supplied from a reference voltage source 23 to one of input nodes of the comparison section 22 and a voltage VOUT at the load terminal T0 side of the output transistor 15 as a voltage to be detected is supplied to the other of the input nodes. The comparison section 22 outputs a comparison result between the third reference voltage and the voltage VOUT as a detection signal DIAG. For example, in the case of the third reference voltage<the voltage VOUT, the comparison section 22 outputs the detection signal DIAG with a High level indicating that abnormality of the load open occurs.

In this way, since the comparison section 22 operates by the current based on the duty of the output signal, the electric power consumption of the detection circuit 12 can be suppressed. In addition, since the intermittent operation is performed by using the standby circuit 11 inside the semiconductor device 3, as described above, the dedicated input terminal of the semiconductor device 3 and the corresponding output terminal of the microcomputer 2 are not required.

Figure 3A:
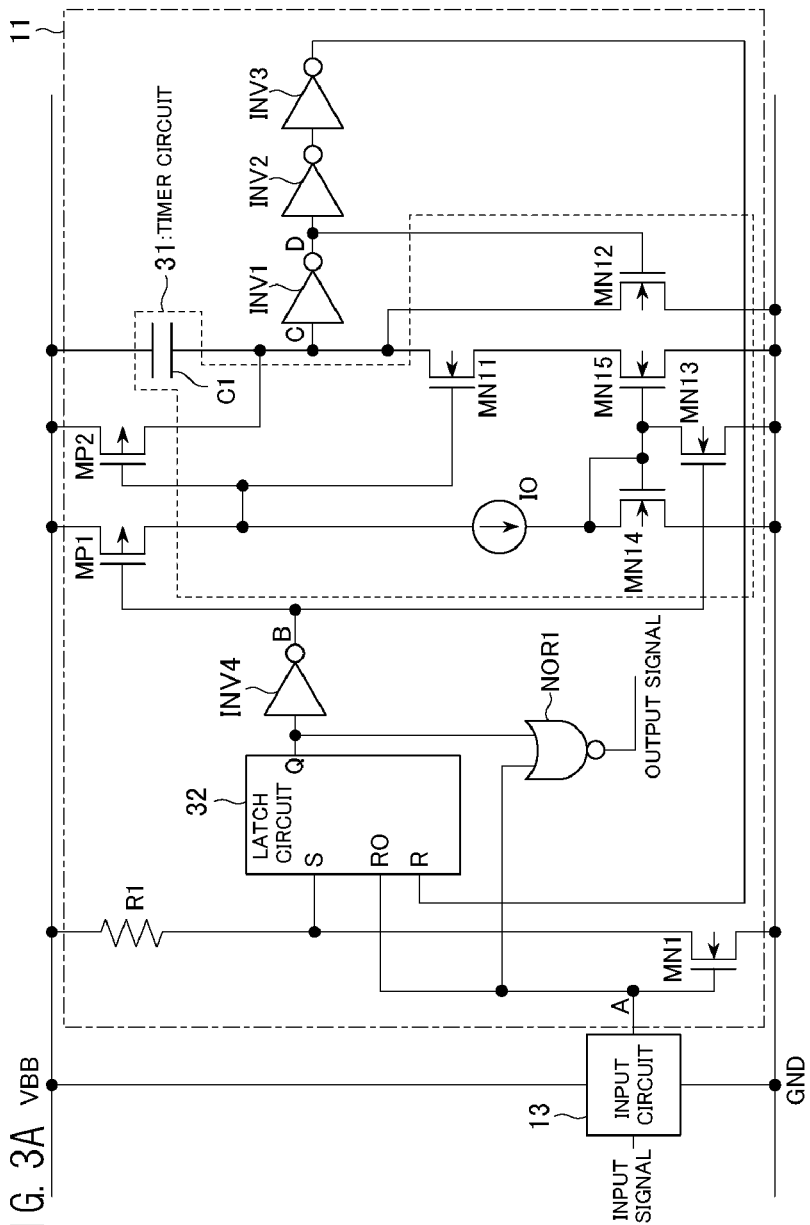
FIG. 3A is a circuit diagram showing an example of a configuration of a standby circuit according to the first embodiment.

FIG. 3A is a circuit diagram showing an example of a configuration of the standby circuit 11 according to the present embodiment. The standby circuit 11 includes a timer circuit 31, inverters INV1 to INV3, a latch circuit 32 and a NOR circuit NOR1. The timer circuit 31 generates a periodical signal when the detection circuit 12 is made to operate intermittently. The inverters INV1 to INV3 generate an intermittent timing signal based on the periodical signal. The latch circuit 32 and the NOR circuit NOR1 intermittently output the output signal in response to the timing signal and the non-active input signal.

The "S" of the latch circuit (RS-FF) 32 is connected to a connection node between both elements in a series connection of an N-ch transistor MN1 and a resistor R1. Here, the other terminal of the transistor MN1 is connected to the first reference voltage GND, the other terminal of the resistor R1 is connected to the second reference voltage VBB, a gate of the transistor MN1 is connected to A point which is an output node of the input circuit 13. The "R0" of the latch circuit 32 is also connected to the A point. The "R" of the latch circuit 32 is connected to an output node of the inverter INV3.

Input nodes of the NOR circuit NOR1 are connected to the "Q" of the latch circuit 32 and the A point. The NOR circuit NOR1 outputs an output signal which is the output signal of the standby circuit 11. The output signal may be inverted if it is necessary.

An input node of the inverter INV4 is connected to the "Q" of the latch circuit 32 and an output node (a B point) of the inverter INV4 is connected to a gate of a P-ch transistor MP1 and (a gate of an N-ch transistor MN13 of) the timer circuit 31. The transistor MP1 is connected to the second reference voltage VBB at one end and connected to a gate of a P-ch transistor MP2 and (a constant current source I0 and a gate of an N-ch transistor MN11 of) the timer circuit 31 at the other end. The transistor MP2 is connected to the second reference voltage VBB at one end and connected to (an output node (a C point) of) the timer circuit 31 at the other end. The transistors MP1 and MP2 control ON/OFF of a below-described current mirror circuit and charge/discharge of a capacitor element C1.

The timer circuit 31 includes the constant current source I0, N-ch transistors MN11 to MN15 and the capacitor element C1. The capacitor element C1 is connected to the second reference voltage VBB at one end and connected to the output node (the C point) at the other end. The transistors MN14 (an input side) and MN15 (an output side) constitute the current mirror circuit with the first reference voltage GND as a source. A gate of the transistor MN14 is connected to a drain of the transistor MN14 and a gate of the transistor MN15. The constant current source I0 is connected to the input side of the current mirror circuit, and one end of the transistor MN11 is connected to the output side of the current mirror circuit. The other end of the transistor MN11 is connected to the other end of the capacitor element C1, the output node (the C point) and the other end of the transistor MN12. One end of the transistor MN12 is connected to the first reference voltage GND. One end of the transistor MN13 is connected to the gates of the transistors MN14 and MN15 constituting the current mirror circuit and the other end of the transistor MN13 is connected to the first reference voltage GND.

The inverters INV1 to INV3 are connected to each other in series. The input node of the inverter INV1 is connected to the output node (the C point) of the timer circuit 31. The output node of the inverter INV1 is connected to a gate of the transistor MN12 and to an input node of the inverter INV2. The output node of the inverter INV3 is connected to the "R" of the latch circuit 32.

It is assumed that the electric potential of the A point of the input circuit 13 becomes a Low level (hereinafter simply referred to as the "L") in the case that the signal for turning off the load 7 (making the semiconductor device 3 be in a non-operating state) is inputted to the input circuit 13. At that time, since the transistor MN1 is turned off, the "S" of the latch circuit 32 becomes in a High level (hereinafter simply referred to as the "H"). The "R0" of the latch circuit 32, which has the same electric potential as the A point, becomes in the "L". In addition, the "L" is inputted to the "R" of the latch circuit 32 at the initial state.

Figure 3B:
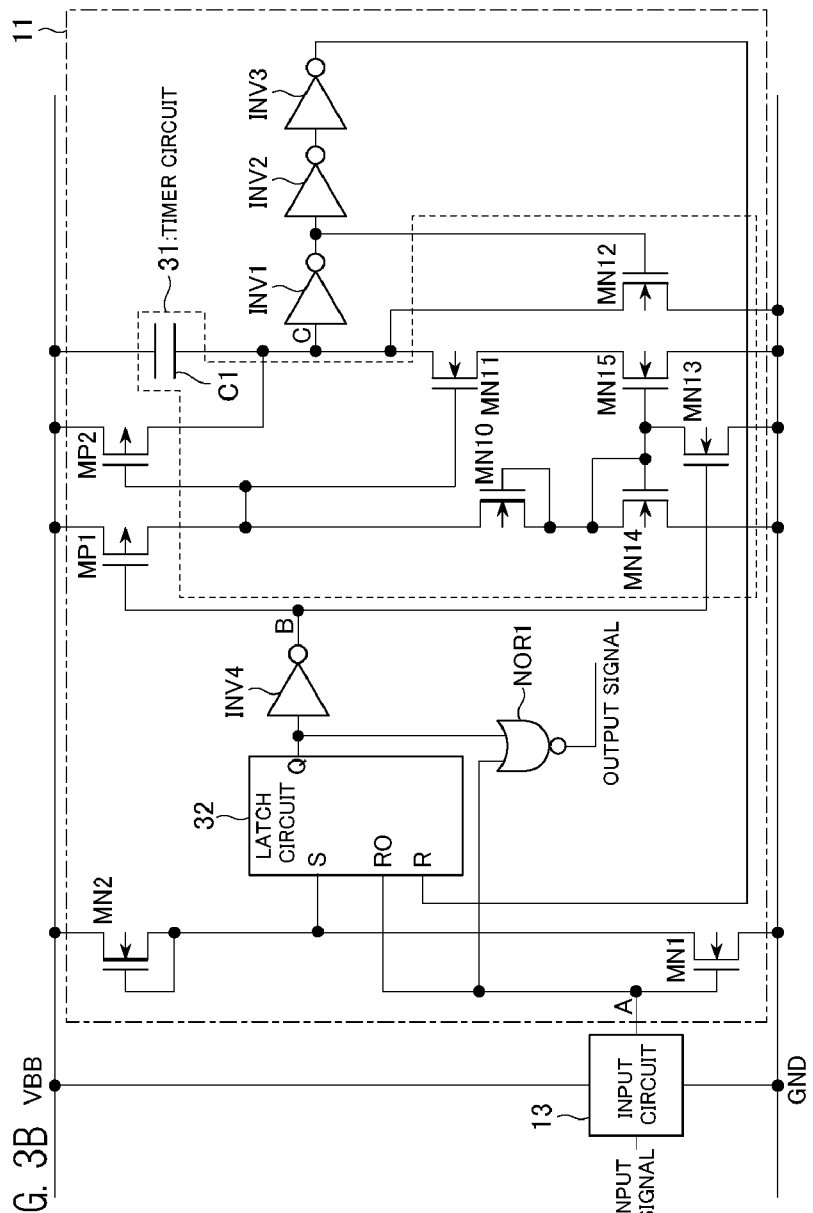
FIG. 3B is a circuit diagram showing another example of a configuration of the standby circuit according to the first embodiment.

FIG. 3B is a circuit diagram showing another example of a configuration of the standby circuit 11 according to the present embodiment. The difference between this figure and FIG. 3A is that a depletion type N-ch transistor MN2 is used instead of the resistor R1 and a depletion type N-ch transistor MN10 is used instead of the constant current source I0.

Figure 4:
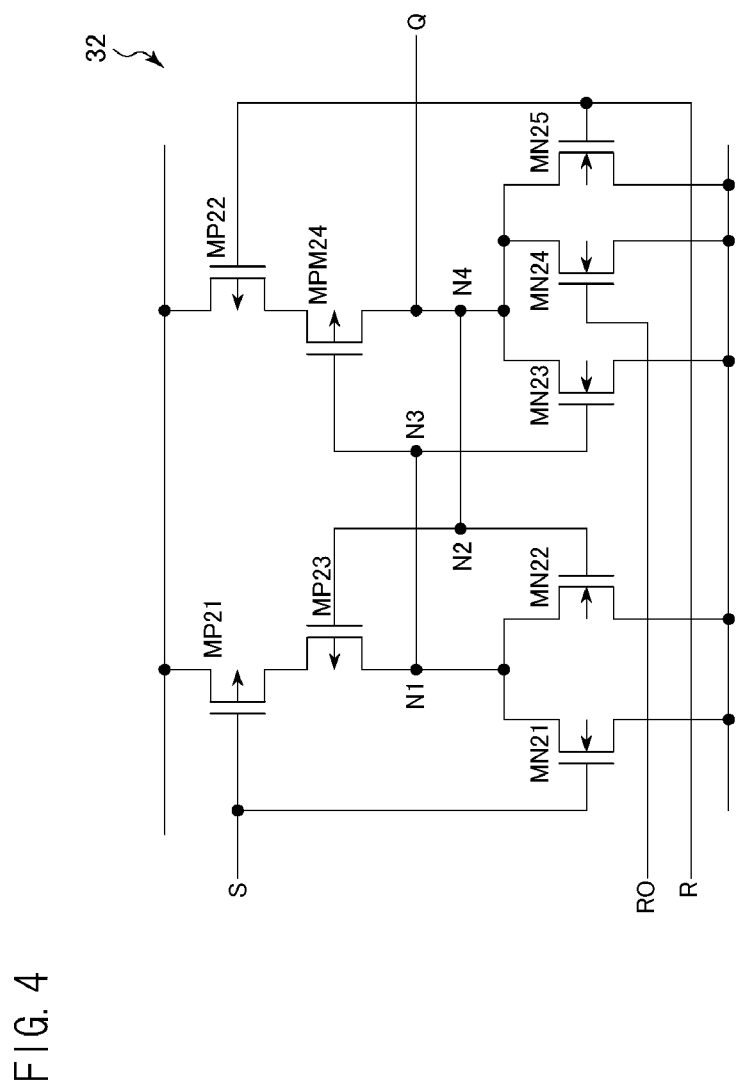
FIG. 4 is a circuit diagram showing an example of a configuration of a latch circuit according to the first embodiment.

FIG. 4 is a circuit diagram showing an example of a configuration of the latch circuit 32 according to the present embodiment. The latch circuit 32 is configured by a NOR type RS-FF. The latch circuit 32 includes P-ch transistors MP21 to MP24 and N-ch transistors MN21 to MN25. The transistor MP21 is connected to the "S" at a gate, connected to the electric power source voltage of the high electric potential side at a source and connected to a source of the transistor MP23 at a drain. The transistor MP23 is connected to a node N2 at a gate and connected to a node N1 at a drain. The transistor MN21 is connected to the "S" at a gate, connected to the electric power source voltage of the low electric potential side at a source and connected to the node N1 at a drain. The transistor MN22 is connected to the node N2 at a gate, connected to the electric power source voltage of the low electric potential side at a source and connected to the node N1 at a drain. The transistor MP22 is connected to the "R" at a gate, connected to the electric power source voltage of the high electric potential side at a source and connected to a source of the transistor MP24 at a drain. The transistor MP24 is connected to a node N3 at a gate and connected to a node N4 at a drain. The transistor MN23 is connected to the node N3 at a gate, connected to the electric power source voltage of the low electric potential side at a source and connected to the node N4 at a drain. The transistor MN24 is connected to the "R0" at a gate, connected to the electric power source voltage of the low electric potential side at a source and connected to the node N4 at a drain. The transistor MN25 is connected to the "R" at a gate, connected to the electric power source voltage of the low electric potential side at a source and connected to the node N4 at a drain. The node N1 and the node N3 are connected to each other. The node N2 and the node N4 are connected to each other and further connected to the "Q".

When the signal for turning on the load 7 (making the semiconductor device 3 be in an operating state) is inputted as the input signal, the electric potential of the A point becomes the "H", then the "L" is inputted to the "S" and the "L" is also inputted to the "R". Therefore, the "Q" becomes indeterminate. To avoid this situation, the transistor MN24 is added. When the signal for turning on the load 7 is inputted, since the electric potential of the A point becomes the "H" and the "H" is inputted to the "R0", the transistor MN24 is turned on and thereby the "Q" can be clamped to the "L".

Next, an operation of the standby circuit 11 according to the present embodiment will be described. FIG. 5 is a timing chart showing an example of an operation of the standby circuit 11 according to the present embodiment. Here, (a) shows the input signal from the microcomputer 2, (b) shows the electric potential of the A point, (c) shows the electric potential of the "S" of the latch circuit 32, (d) shows the electric potential of the "R0" of the latch circuit 32, (e) shows the electric potential of the "R" of the latch circuit 32, (f) shows the electric potential of the "Q" of the latch circuit 32, (g) shows the electric potential of the B point of the output node of the inverter INV4, (h) shows the electric potential of the C point of the output node of the timer circuit 31, (i) shows the electric potential of the D point of the output node of the inverter INV 1, and (j) shows the output signal of the standby circuit 11. Hereinafter, the standby circuit 11 in FIG. 3A will be described.

At the time t01, in the case (the OFF state) that the input signal ("L") for turning off the load 7 (turning off the semiconductor device) is inputted to the input circuit 13 from the microcomputer 2, the electric potential of the A point of the input circuit 13 and the electric potential of the "R0" of the latch circuit 32 become the "L". In addition, when the electric potential of the A point is the "L", since the transistor MN1 is turned off, the "H" is inputted to the "S" of the latch circuit 32. The "L" is inputted to the "R" of the latch circuit 32 at the initial stage. As a result, the output "Q" of the latch circuit 32 becomes the "H" and its inverted signal, that is, the electric potential of the B point becomes the "L". When the electric potential of the B point is the "L", the electric potential ("H") of the C point starts to decrease depending on the time constant determined by capacitance of the capacitor element C1 and the constant current source I0. However, its inverted signal, namely the electric potential of the D point maintains the "L".

At the time t02, the electric potential of the D point is inverted from the "L" to the "H" when the electric potential of the C point decreases to a certain value. The electric potential "H" is inputted to the "R" of the latch circuit 32 as a reset signal through the inverters IV2 and IV3 at the time t03. When the reset signal is inputted to the latch circuit 32, the output "Q" of the latch circuit 32 becomes the "L". As a result, the "H" is outputted as the output signal by the NOR operation between the "L" of the output "Q" and the "L" of the electric potential of the A point at the time T04. The output signal "H" is outputted to the detection circuit 12 as the output of the standby circuit 11.

At the same time, at the time t04, the electric potential of the B point becomes the "H" and then the electric potential of the C point is pulled up to the "H". When the electric potential of the C point is the "H", the electric potential of the D point becomes the "L" at the time t05. The electric potential "L" is inputted to the "R" of the latch circuit 32 through the inverters INV2 and INV3 at the time T06. The output "Q" of the latch circuit 32 becomes the "H", again. At a result, the "L" is outputted as the output signal by the NOR operation between the "H" of the output "Q" and the "L" of the electric potential of the A point at the time t07. At the same time, the electric potential of the B point becomes the "L" at the time t07.

When the input signal maintains the "L", that is, when the input signal "L" which turns off the load 7 is being inputted (the semiconductor device 3 is in an OFF state), the above-described operation is repeated. That is, the operation from the time just after the time t01 to the time t07 is repeated subsequently. In the example of FIG. 5, the operation from the time just after the time t01 to the time t07 is repeated from the time just after the time t07 to the time t09. When the input signal becomes the "H", that is, when the input signal "H" which turns on the load 7 is inputted (the semiconductor device 3 is in an ON state), the above-described operation is stopped and the output signal is the "L" contentiously. The timing of the intermittent operation in which the output signal is outputted can be appropriately set, for example, a period from the time t01 to the time t07 may be about 10 milliseconds to 100 milliseconds and a period from the time t04 to the time t07 when the output signal is outputted may be about 100 microseconds to 10 milliseconds.

As described above, the standby circuit 11 according to the present embodiment operates.

The standby circuit 11 according to the present embodiment can intermittently change the output signal into the "H". If a circuit is configured by using this standby circuit 11, electric power can be supplied to a circuit to be operated based on the output signal only when the output signal is the "H" (the period from the time t04 to the time t07). That is, the circuit to be operated (the detection circuit 12 as one of the functions in the IPD) can be made to be in a standby state during the period when the output signal is the "L" (from the time t01 to the time t04), and the circuit to be operated can be made to be in an operating state (only the detection circuit 12 is in an ON state) during the period when the output signal is the "H" (from the time t04 to the time t07). In other words, the standby circuit 11 repeats the standby state (e.g. the period from the time t01 to the time t04) and the operating state (e.g. the period from the time t04 to the time t07) alternately. Consequently, in the circuit to be operated, the circuit current can depend on the duty of the output signal. That is, the operation in which the load open detection is performed intermittently (or periodically) when the load is in an OFF state can be realized inside the IPD in a self-contained manner.

When the standby circuit 11 is applied to the configuration of the semiconductor device 3 in FIG. 2, a signal in which the output signal ((j) in FIG. 5) is inverted by the inverter 21a is inputted to the gate of the P-ch transistor 21b. That can make the circuit current be supplied to the detection circuit 12 only during the period when the output signal is the "H" to make the detection circuit 12 operate. That is, the circuit operation of the detection circuit 12 can be performed intermittently (or periodically). Consequently, the current of the circuit operation of the detection circuit 12 can be reduced.

In FIG. 3A, since the standby circuit assumes the CMOS configuration except for the timer circuit section, the through-current flows when inverting. To decrease the through-current apparently, the appropriate long period (e.g. 10 milliseconds or more) is required for the intermittent operation. Therefore, as for the constant current source I0, very small current is suitable and it is designed so as to be, for example, 1 μA (microampere) or less. As for the current mirror MN14 and MN15, the ratio (e.g. 100:1) in which the current is further decreased is set. Then, the charge/discharge of the capacitor element C1 is performed by using the very small current. This leads the long period to be realized. Consequently, the operation current of the timer circuit 31 can be suppressed about 1 μA.

The operation current of the standby circuit 11 is the operation current of the timer circuit 31 and the through-current of other CMOS section. However, if the period of about 10 milliseconds is ensured, the operation current of the standby circuit 11 is suppressed lower than 1 μA apparently. Further, if the CMOS circuit in which the through-current countermeasures are carried out is used, the operation current is decreased further. Incidentally, in FIG. 5, the width (from the time t02 to the time t05) of the signal of the D point is generated by the gate delay of the inverters INV1, INV2 and INV3. Therefore, the duty is required to be adjusted by adjusting the delay of the inverters INV1, INV2 and INV3. If the width of the signal of the D point is desired to be lengthened, the through-current is required to be decreased naturally, and therefore, the duty adjustment is hardly affected to the circuit current.

For example, in the case that the operation current of the detection circuit 12 is 300 μA and the duty of the intermittent operation is 5%, by using the standby circuit 11, the circuit current is: 1 μA (for the timer circuit)+1 μA (for the CMOS through-current)+300 μA×0.05 (the duty: 5%)=17 μA. Thus, the circuit current can be reduced significantly as compared with a continuous operation.

If it is desired that the circuit current is further reduced, by lengthening the period while the minimum required width of the signal of the D point is ensured, the duty of the intermittent operation can be decreased such as 1%, thereby the circuit current can be reduced to 5 μA.

Next, an operation of the electronic component system 1 according to the present embodiment will be described. FIG. 6 is a timing chart showing an example of the operation of the electronic component system 1 according to the present embodiment. Here, (a) shows the ignition signal, (b) shows the ON/OFF signal of the operation switch of the load 7, (c) shows the operation of the microcomputer 2, (d) shows the electric potential of the output port P1 of the microcomputer 2, (e) shows the electric potential of the output port P2 of the microcomputer 2, (f) shows the electric potential of the input port of the microcomputer 2, (g) shows the circuit current of the semiconductor device 3, (h) shows the output signal ((j) of FIG. 5) of the standby circuit 11, (i) shows the electric potential OUT of the load terminal T0 side of the output transistor 15, and (j) shows the electric potential of the detection signal DIAG of the detection circuit 12. Hereinafter, the electronic component system 1 of FIG. 1 to which the semiconductor device 3 of FIG. 2 is applied will be described.

Until the time ta1, which is the same timing as the time t01 of FIG. 5, the semiconductor device 3 operates normally.

At the time ta1, a user turns off the operation switch of the load 7 and the signal is supplied to the microcomputer 2. The microcomputer 2 outputs the "L" from the output port P1, and then the electric potential of the input terminal T2 of the semiconductor device 3 becomes the "L", and thus the semiconductor device 3 is turned off (in an OFF state). When the electric potential of the input terminal T2 is the "L", the standby circuit 11 in the semiconductor device 3 operates and outputs the output signal (h) at regular time intervals to turn on the P-ch transistor 21b which is provided at the upper stream of the comparison section 22 in FIG. 2.

At the time ta2, which is the same timing as the time t04 of FIG. 5, the above-mentioned output signal is outputted and the detection circuit 12 operates in a certain time period. In FIG. 6, this certain time period is indicated as "ONLY DETECTION CIRCUIT IS ON".

At the time ta3, the ignition is turned off and the microcomputer 2 is turned off to go into a sleep mode. In the sleep mode, the microcomputer 2 is periodically turned on and monitors the load of the device or the like only during the on-period.

At the time ta4, the microcomputer 2 performs the operation of monitoring the load. However, the load open is not detected at that time.

At the time ta5, the abnormality of the load open occurs and the electric potential OUT of the load terminal T0 side of the output transistor 15 is pulled up to the VBB potential by the leakage current of the semiconductor device 3.

At the time ta6, the detection circuit 12 in the semiconductor device 3 operates again and detects the load open to output the detection signal DIAG to the microcomputer 2. However, at that time, since the microcomputer 2 does not operate, the microcomputer 2 cannot store the detection signal DIAG indicating that the load open is detected.

At the time ta7, the microcomputer 2 operates again. However, at that time, since the detection signal DIAG indicating that the load open is detected is not outputted, the microcomputer 2 cannot recognize the load open.

At the time ta8, the ignition is turned on. However, since the microcomputer 2 does not recognize (store) the load open, the microcomputer 2 cannot output the information regarding the load open to the instrument panel 4. However, the standby circuit 11 in the semiconductor device 3 keeps on operating.

At the time ta9, the detection circuit 12 in the semiconductor device 3 operates again and detects the load open to output the detection signal DIAG to the microcomputer 2. At that time, since the microcomputer 2 is operating, the microcomputer 2 recognizes the detection signal DIAG indicating that the load open is detected. Then, the microcomputer 2 outputs the information regarding the load open to the instrument panel 4 to make the instrument panel 4 display the load open information. As a result, by seeing at the instrument panel 4, the user (e.g. a driver) understands the load open (e.g. the bulb of the headlight is out).

As described above, the electronic component system 1 according to the present embodiment operates.

However, the abnormality notification to the user is not limited to the display on the instrument panel 4. For example, displaying by using other equipment, sounding of alarm, notifying by using a voice guide and the like may be used.

In the present embodiment, the abnormality of the load open is the subject of the abnormality detection. However, even in the case that other abnormality is the subject of the abnormality detection, the present embodiment can be applied. This fact is the same as other embodiments.

In the present embodiment, by incorporating the standby circuit 11 which operates intermittently when the operation switch of the load is OFF, the semiconductor device 3 can make the detection circuit 12 operate without the control by the microcomputer 2. Thus, it is unnecessary to provide the dedicated input terminal which makes the detection circuit 12 operate for checking the state of the load when the operation switch is OFF. Correspondingly, in the microcomputer 2, it is unnecessary to provide the dedicated output port which outputs the control signal to the dedicated input terminal of the semiconductor device 3. Hence, the burden to the microcomputer 2 can be reduced. Since the standby circuit 11 makes the detection circuit 12 operates intermittently (or periodically), the operation time of the detection circuit 12 can be reduced as compared with the case of the continuous operation. Therefore, the circuit current can be decreased and the electric power consumption can be suppressed lower.

Consequently, in the checking of the state of the load, the number of terminals (pins) of the semiconductor device (IPD) can be reduced while the burden to the microcomputer is decreased and electric power consumption is reduced.

Second Embodiment

Next, a configuration of the semiconductor device according to the second embodiment will be described. The present embodiment is different from the first embodiment in that the detection circuit 12 operates further even when the operation switch of the load 7 is ON. Hereinafter, the difference will be mainly described.

In the first embodiment, when the operation switch of the load 7 is ON, that is, the semiconductor device 3 is ON (in an ON state), the detection circuit 12 does not operate. Because, when the operation switch is ON, the input signal becomes the "H", the output signal from the standby circuit 11 becomes the "L", the switch section 21 of the detection circuit 12 is OFF and thus the comparison section 22 does not operate. Therefore, in the first embodiment, in addition to the functions (e.g. the excess current detection, excess voltage detection and overheat detection) which are normally provided when the IPD is in an ON state, the function which detects the load open in the self-contained manner even when the IPD is in an OFF state is added. On the other hand, the semiconductor device 3 of the present embodiment is devised such that the detection circuit is used for detecting the load open not only when the IPD is in an OFF state but also when the IPD is in an ON state.

FIG. 7A is a block diagram partially showing the configuration of the semiconductor device 3 according to the present embodiment. The detection circuit 12 of the semiconductor device 3 further includes a switch section 24. ON/OFF of the switch section 24 is controlled by the input signal from the input circuit 13. The switch section 24 includes, for example, an inverter 24a and a P-ch transistor 24b. The inverter 24a is connected to the input circuit 13 at an input node and connected to a gate of the P-ch transistor 24b at an output node. The P-ch transistor 24b is connected to the second reference voltage VBB at a source and connected to one of the electric power source nodes of the comparison section 22 at a drain. The current supply to the comparison section 22 is control led by not only the ON/OFF of the switch section 21 based on the output signal of the standby circuit 11 but also the ON/OFF of the switch section 24 based on the input signal from the input circuit 13.

In the present embodiment, when the operation switch is ON, the output of the inverter 24a is the "L" because the output of the input circuit 13 is the "H". Therefore, the P-ch transistor 24b is turned on and the electric power is supplied to the comparison section 22. When the operation switch is OFF, the output of the inverter 24a is the "H", and therefore the P-ch transistor 24b is turned off. The other operations are the same as those of the first embodiment.

FIG. 7B is a circuit diagram showing another example of the configuration of the standby circuit 11 according to the present embodiment. The difference from FIG. 3B is that an inverter INV5 is used instead of the NOR circuit NOR1. The inverter INV5 is connected to the "Q" of the latch circuit 32 at an input node. Output on the inverter INV5 is the output signal of the standby circuit 11. The control by the ON/OFF of the switch section 21 based on the output signal of the standby circuit 11 is as described in the first embodiment, which is the intermittent control when the operation switch of the load 7 is OFF. On the other hand, the control by the ON/OFF of the switch section 24 based on the input signal from the input circuit 13 is the control added in the present embodiment, which is the continuous control when the operation switch of the load 7 is ON. By combining the configuration of FIG. 7A and the configuration of 7B, in the case that not only the operating switch of the load 7 is OFF but also the operating switch of the load 7 is ON, the detection circuit 12 can check whether or not the abnormality of the load 7 occurs. That is, not only when the operation switch of the load 7 is ON but also when the operation switch of the load 7 is OFF, one detection circuit 12 can check whether or not the abnormality of the load 7 occurs.

In the present embodiment, the same effects as the first embodiment can be obtained.

In addition, even in the case that the operation switch is ON, the detection circuit 12 can be made to operate.

Third Embodiment

Next, a configuration of the semiconductor device according to the third embodiment will be described. The present embodiment is different from the first embodiment in that the load open can be detected even when the ignition is OFF and the information can be held continuously. Hereinafter, the difference will be mainly described.

In the first embodiment, the operation of the microcomputer 2 and the operation of the detection circuit 12 of the semiconductor device 3 are asynchronous when the ignition is OFF. Therefore, since there is a possibility that the microcomputer 2 cannot detect the load open when the ignition is OFF, the microcomputer 2 detects the load open when the ignition is turned on. On the other hand, in the present invention, the load open cam be detected and its information can be held continuously even when the ignition is OFF.

Figure 8:
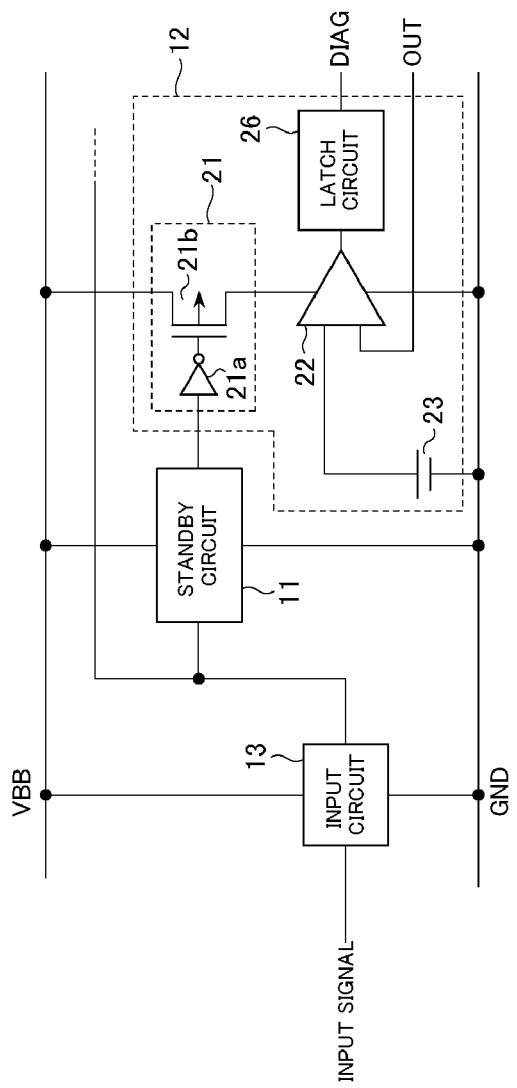
FIG. 8 is a block diagram partially showing a configuration of a semiconductor device according to a third embodiment.

FIG. 8 is a block diagram partially showing the configuration of the semiconductor device 3 according to the present embodiment. The detection circuit 12 of the semiconductor device 3 further includes a latch circuit 26 (a memory section). The latch circuit 26 latches (stores) the detection signal DIAG indicating the comparison result of the comparison circuit 22 and continuously outputs the detection signal DIAG to the input port of the microcomputer 2.

Next, an operation of the electronic component system 1 according to the present embodiment will be described. FIG. 9 is a timing chart showing an example of the operation of the electronic component system 1 according to the present embodiment. Here, (a) to (j) show the same signals and potentials as those of the first embodiment. Hereinafter, the electronic component system 1 of FIG. 1 to which the semiconductor device 3 of FIG. 8 is applied will be described.

The explanation of an operation from the time ta1 to the time ta6 is omitted because the operation is the same as that of the first embodiment (FIG. 6).

At the time ta6, the detected load open is held inside the semiconductor device 3 (the latch circuit 26). The latch circuit 26 keeps on outputting the detection signal DIAG after the detection of the load open (after the time ta6). Since it is necessary to make current flow through an external resistor of the semiconductor device 3, the IPD circuit current, which is very small, is continuously flowing.

At the time ta7, the microcomputer 2 is operating again. At that time, since the detection signal DIAG is being outputted continuously, the microcomputer 2 can store the load open state.

At the time ta8, the ignition is turned on. At that time, since the microcomputer 2 recognizes (stores) the load open, the microcomputer 2 can output the load open to the instrument panel 4. That is, the microcomputer 2 outputs the load open to the instrument panel 4 to make the instrument panel 4 display the load open. As a result, by seeing the instrument panel 4, the user (e.g. the driver) gets to know about the load open (e.g. the bulb of the headlight is out).

As described above, in the present embodiment, even though the operation of the semiconductor device 3 and the operation of the microcomputer 2 are asynchronous, after the semiconductor device 3 detects the load open, the microcomputer 2 can recognize (store) the load open at the same time as the start of the operation of the microcomputer 2.

In the present embodiment, for example, an application example can be considered in which the circuit current is reduced by controlling the output of the detection signal DIAG based on the inversion signal of the output signal and by decreasing the duty slightly. Furthermore, another application example can be considered in which the circuit current is reduced by not using the latch circuit 26 but using a one-shot pulse generating circuit to output the detection signal DIAG for, namely, 0.5 seconds in response to the detection of the load open as a trigger. Here, it is assumed that the 0.5 seconds is sufficiently longer than the intermittent operation period (e.g. 100 milliseconds period and 10 milliseconds ON) of the microcomputer 2. In addition, the latch circuit 26 can be applied to the second embodiment.

In the present embodiment, the same effects as those of the first embodiment can be obtained.

In addition, as compared with the first embodiment, the load open can be recognized earlier (at the time ta8 before the time ta9).

Even though the semiconductor device according to each of the above-described embodiments is applied to equipment other than the automobile, similarly to the case of applying to the automobile, the above-described effects can be obtained. That is, even though a microcomputer is in an OFF state, a state of a device (a load) can be detected. Consequently, at approximately the same time when the microcomputer becomes in an ON state, a user can get to know about the state (the abnormality) of the device before driving the device (turning on a start switch of the device). As the equipment to which the semiconductor device is applied, the equipment is exemplified in which a main electric power source for the equipment body is different from an electric power source for a device installed inside the equipment body. Here, it is assumed that the electric power source for the installed device can be turned on when the main electric power source for the equipment body is ON. In this case, at approximately the same time when the main electric power source for the equipment body is turned on, even though the electric power source for the installed device is OFF the abnormality of the installed device can be recognized. As a result, the user can deal with the abnormality early. Therefore, a situation possibly occurring with the abnormality can be prevented before anything happens.

Specifically, when the semiconductor device according to each of the above-described embodiments is applied to the automobile, remarkable effects with respect to safe driving can be produced. For example, in the automobile, if the engine is OFF, it is necessary to make electric devices operate with a limited electric power source (a battery). Thus, by using the present semiconductor device which intermittently operate for a function continuously checking abnormality, electric power consumption can be suppressed and battery running out can be prevented even for an automobile of a user who hardly drive the automobile. Furthermore, for example, at approximately the same time when a main electric power source (an ignition) for an automobile body as the equipment body, even though an electric power source for a lamp as the installed device is OFF, a user can get to know about the abnormality (e.g. the bulb of the lamp is out) of the lamp. As the result, the user can deal with the abnormality of the lamp before the user stats driving the automobile. Consequently, the situation can be prevented before it happens, the situation being that the user tries to turn on the lamp when it is getting dark outside while driving and finds the abnormality of the lamp which cannot be dealt with. Moreover, for example, at approximately the same time when a main electric power source (an ignition) for an automobile body as the equipment body, even though an electric power source for an air conditioner as the installed device is OFF, a user can get to know about the abnormality (e.g. the fuse is blown) of the air conditioner. As the result, the user can deal with the abnormality of the air conditioner before the user stats driving the automobile. Consequently, the situation can be prevented before it happens, the situation being that the user tries to turn on the air conditioner when the windshield has fogged up while driving and finds the abnormality of the air conditioner which cannot be dealt with.

The various techniques described in one of the above-described embodiments can be applied to the other of the above-described embodiments if there is no the technical inconsistency.

Although the invention has been described above in connection with several embodiments thereof, it would be apparent that the present invention is not limited to the above embodiments, but may be modified and changed without departing from the scope and spirit of the invention.

What is claimed is:

1. A semiconductor device comprising:
    a first terminal;
    a drive circuit configured to turn off an output transistor connected to a load based on a non-active input signal applied at the first terminal to not connect the load to an electrical power source;
    a standby circuit configured to intermittently output an output signal based on the non-active input signal applied at the first terminal, and to not output the output signal based on the active input signal applied at the first terminal; and
    a detection circuit configured to measure voltage of a load side of the output transistor based on the output signal and output a measurement result, wherein
    the detection circuit operates based on the non-active input signal.

2. The semiconductor device according to claim 1, wherein the detection circuit includes:
    a memory section configured to store the measurement result, wherein the detection circuit outputs the measurement result in the memory section.

3. The semiconductor device according to claim 1, wherein the detection circuit includes:
    a switch section configured to be turned on based on the output signal, and
    a measurement section configured to measure the voltage when the switch is turned on and output the measurement result.

4. The semiconductor device according to claim 1, wherein the detection circuit includes:
    a first switch section configured to be turned on based on the output signal,
    a measurement section configured to measure the voltage when the first switch is turned on and output the measurement result, and
    a second switch section configured to be turned on based on the active input signal.

5. The semiconductor device according to claim 2, wherein the detection circuit includes:
    a switch section configured to be turned on based on the output signal, and
    a measurement section configured to measure the voltage when the switch is turned on and output the measurement result,
    wherein the memory section stores the measurement result outputted from the measurement section.

6. The semiconductor device according to claim 1, further comprising:
    the output transistor.

7. An electronic component system comprising:
    an electric power source;
    a load;
    a microcomputer; and
    a semiconductor device configured to control connection between the load and the electric power source and control whether or not the load is connected based on an input signal from the microcomputer,
    wherein the semiconductor device includes:
    a first terminal;
    a drive circuit configured to turn off an output transistor connected to the load based on an non-active input signal applied at the first terminal to not connect the load to the electrical power source, a standby circuit configured to intermittently output an output signal based on the non-active input signal applied at the first terminal, and to not output the output signal based on the active input signal applied at the first terminal, and a detection circuit configured to measure voltage of a load side of the output transistor based on the output signal and output a measurement result, wherein the detection circuit operates based on the non-active input signal.

8. The electronic component system according to claim 7, wherein the detection circuit includes:
a memory section configured to store the measurement result,
wherein the detection circuit outputs the measurement result in the memory section.

9. The electronic component system according to claim 7, wherein the detection circuit includes:
a switch section configured to be turned on based on the output signal, and
a measurement section configured to measure the voltage when the switch is turned on and output the measurement result.

10. The electronic component system according to claim 7, wherein the detection circuit includes:
a first switch section configured to be turned on based on the output signal,
a measurement section configured to measure the voltage when the first switch is turned on and output the measurement result, and
a second switch section configured to be turned on based on the active input signal.

11. The electronic component system according to claim 8, wherein the detection circuit includes:
a switch section configured to be turned on based on the output signal, and
a measurement section configured to measure the voltage when the switch is turned on and output the measurement result,
wherein the memory section stores the measurement result outputted from the measurement section.

12. The electronic component system according to claim 7, wherein the semiconductor device further includes:
the output transistor.

13. The electronic component system according to claim 7, further comprising:
a display device,
wherein the microcomputer outputs a measurement result outputted from the semiconductor device to the display device, and
wherein the display device displays information based on the measurement result.

14. An operation method of a semiconductor device comprising:
turning off an output transistor connected to a load based on a non-active input signal applied at a first terminal to not connect the load to an electrical power source;
intermittently outputting from a standby circuit an output signal based on the non-active input signal applied at the first terminal, and not outputting the output signal based on an active input signal applied at the first terminal; and
measuring voltage of a load side of the output transistor based on the output signal and outputting a measurement result from a detection circuit, wherein the detection circuit operates based on the non-active input signal.

* * * * *